(12) United States Patent
Cosand

(10) Patent No.: US 7,158,062 B2
(45) Date of Patent: Jan. 2, 2007

(54) CLOCKED DAC CURRENT SWITCH

(75) Inventor: Albert E. Cosand, Agoura Hills, CA (US)

(73) Assignee: Raytheon Company, Waltham, MA (US)

( * ) Notice: Subject to any disclaimer, the term of this patent is extended or adjusted under 35 U.S.C. 154(b) by 207 days.

(21) Appl. No.: 10/761,790

(22) Filed: Jan. 21, 2004

(65) Prior Publication Data

US 2005/0156764 A1 Jul. 21, 2005

(51) Int. Cl.
*H03M 3/00* (2006.01)

(52) U.S. Cl. .................. 341/143; 341/133; 341/136

(58) Field of Classification Search ............ 341/133, 341/136, 143, 144
See application file for complete search history.

(56) References Cited

U.S. PATENT DOCUMENTS

| | | | | |
|---|---|---|---|---|
| 4,663,610 | A | * | 5/1987 | Metz et al. ............... 341/133 |
| 4,733,218 | A | * | 3/1988 | Traa ....................... 341/133 |
| 5,245,343 | A | * | 9/1993 | Greenwood et al. ...... 341/143 |
| 6,061,010 | A | * | 5/2000 | Adams et al. ............ 341/144 |
| 6,292,121 | B1 | * | 9/2001 | Cake et al. ............... 341/143 |
| 6,396,428 | B1 | * | 5/2002 | Cheng .................... 341/143 |
| 6,445,322 | B1 | * | 9/2002 | Watson ................... 341/144 |
| 6,518,906 | B1 | * | 2/2003 | Abel et al. ............... 341/144 |
| 6,597,303 | B1 | * | 7/2003 | Cosand ................... 341/165 |
| 6,628,220 | B1 | * | 9/2003 | Cosand ................... 341/144 |
| 6,778,116 | B1 | * | 8/2004 | Skones et al. ............ 341/144 |
| 6,888,485 | B1 | * | 5/2005 | Splett et al. ............. 341/144 |

OTHER PUBLICATIONS

R. Adams, Khiem Nguyen & K. Sweetland, "A 113dB SNR Oversampling DAC with Segmented Noise-shaped Scrambling," IEEE International Symposium on Circuits and Systems, 1998, pp. 62-64, no month.

K.T. Chan & K.W. Martin, "Components for a GAAS Delta-Sigma Modulator Oversampled Analog-To-Digital Converter," IEEE International Symposium on Circuits and Systems, 1992, pp. 1300-1303, no month.

* cited by examiner

*Primary Examiner*—Rexford Barnie
*Assistant Examiner*—Khai Nguyen
(74) *Attorney, Agent, or Firm*—Leonard A. Alkov; Karl A. Vick

(57) ABSTRACT

A switch having a first arrangement for providing a first set of first and second complementary intermediate signals; a second arrangement for providing a second set of third and fourth complementary intermediate signals; a third arrangement responsive to the first set of signals for providing complementary output signals; a fourth arrangement responsive to the second set of signals for providing complementary output signals; and a fifth arrangement for selectively activating the third means or the fourth arrangement in response to a control signal.

51 Claims, 2 Drawing Sheets

CLOCKED DAC CURRENT SWITCH

CROSS-REFERENCE TO RELATED APPLICATION

This Application relates to U.S. Pat. No. 7,002,499, issued Feb. 21,2006, entitled Clocked D/A Converter, formally U.S. patent application Ser. No. 10/763,071, by Todd Kaplan and Albert E. Cosand, filed on the same date of the present Application, the disclosure of which is incorporated herein by reference in its entirety.

BACKGROUND OF THE INVENTION

1. Field of the Invention

The present invention relates to electrical and electronic circuits and systems. More specifically, the present invention relates to systems and methods for current switching within digital to analog converters.

2. Description of the Related Art

Currently 'oversampled' delta-sigma ($\Delta\Sigma$) modulator type analog-to-digital (ADC) converters are used for applications requiring accurate conversion of analog signals to digital signals at high speed. As is known in the art, a $\Delta\Sigma$ ADC (also known as a sigma-delta modulator ADC) typically includes an integrator in front of a quantizer. The quantizer provides a digital staircase approximation of the analog input signal. A delta sigma modulator with multibit feedback uses single bit feedback. In this case, the quantizer is typically a single comparator. Further, a $\Delta\Sigma$ ADC includes one or more feedback loops, which include multi-bit (or single bit) feedback DACs, to avoid the accumulation of quantization errors and to stabilize the $\Delta\Sigma$ ADC.

Delta-sigma modulators allow for the use of low-resolution components running at a higher sampling rate to provide a high resolution ADC converter at a lower sampling rate. Delta-sigma modulators allow for lower costs and higher accuracy than could otherwise be achieved without a delta-sigma modulator. Sigma-delta modulator (ADC) converters include a delta-sigma modulator and a digital filter, which processes the output thereof.

A highly precise current switch is needed for current switching of continuous-time analog to digital converters (ADCs) employed in delta-sigma modulators. A simple differential pair of transistors driven by a clocked latch has been used in the past to provide current switching for ADCs used in delta-sigma modulators. However, simple differential pair current switches may be sensitive to thermal history and produce an effect known as 'intersymbol interference'). That is, if the latch has been switched to one state for a sufficient period of time, one transistor heats more than the other and changes its switch threshold. When the signal driving the switch has a non-zero risetime, this has the effect of changing the timing of the switch transition. Such thermal errors are difficult to characterize and compensate for.

Traditional approaches for suppressing intersymbol interference include a return-to-zero (RZ) configuration where the DAC current is gated off during part of each clock cycle. However, this requires faster operation of the DAC switch, adds another data edge that is subject to clock jitter, and produces a much less smooth output.

More recently, Adams et al. described a scheme with two interleaved RZ DACs to provide a more continuous output than does a singe RZ DAC. (See "A 113dB SNR Oversampling DAC with Segmented Noise-Shaped Scrambling", IEEE Solid-State Circuits Conference, 1998.) This approach consumes additional current, is subject to clock jitter, and does not cancel all thermal effects.

A Application entitled "Clocked D/A Converter," also filed Jan. 21, 2004 as U.S. patent application Ser. No. 10/763,071, now U.S. Pat. No. 7,002,499, issued Feb. 21, 2006 by Todd Kaplan and Albert E. Cosand, the teachings of which are hereby incorporated herein by reference, describes a latch used as a DAC switch. Unfortunately, in its simplest form, this circuit is sensitive to the voltage swing at the output summing nodes. This sensitivity can be alleviated by the addition of a common-base output stage, but that may increase the required supply voltage.

Inasmuch as the ADC is typically used in continuous time feedback loop, the timing errors become errors in the analog signals output from the ADC.

Hence, a need remains in the art for a precise switch for use in applications such as a feedback digital to analog converter in a continuous time sigma-delta or delta-sigma modulator.

SUMMARY OF THE INVENTION

The need in the art is addressed by the switch of the present invention. In the illustrative embodiment, the inventive switch includes a first circuit responsive to a first set of complementary input signals for providing complementary output signals; a second circuit responsive to a second set of complementary input signals for providing complementary output signals; and a third circuit for selectively activating the first circuit or the second circuit in response to a control signal.

In a specific illustrative embodiment, the first set of complementary input signals is provided by a master latch and the second set of complementary input signals is provided by a second latch, slaved to the master. The specific illustrative embodiment further includes a first differential pair of transistors having first and second transistors Q1 and Q2, respectively, and a second differential pair of transistors having third and fourth transistors Q3 and Q4, respectively. The outputs from the master latch are inputs to the first differential pair and the outputs from the slave latch are inputs to the second differential pair. A third differential pair is used to select whether the first differential pair or the second differential pair drives the outputs of the switch. The third differential pair is controlled by complementary clock signals and switches current from a current source in response thereto.

In the illustrative application, the invention is incorporated into a delta-sigma modulator and provides a DAC switch which is insensitive to its thermal history. That is, the inventive switch may be expected to suppress intersymbol interference errors that can result from switching time variations due to a variety of causes, including transient thermal shifts in switching threshold at the switch or in offset of the circuit that drives the switch, or long settling time constants in the switch driver, etc.

DESCRIPTION OF THE INVENTION

Illustrative embodiments and exemplary applications will now be described with reference to the accompanying drawings to disclose the advantageous teachings of the present invention.

While the present invention is described herein with reference to illustrative embodiments for particular applications, it should be understood that the invention is not limited thereto. Those having ordinary skill in the art and access to the teachings provided herein will recognize additional modifications, applications, and embodiments within the scope thereof and additional fields in which the present invention would be of significant utility.

Figure 1:
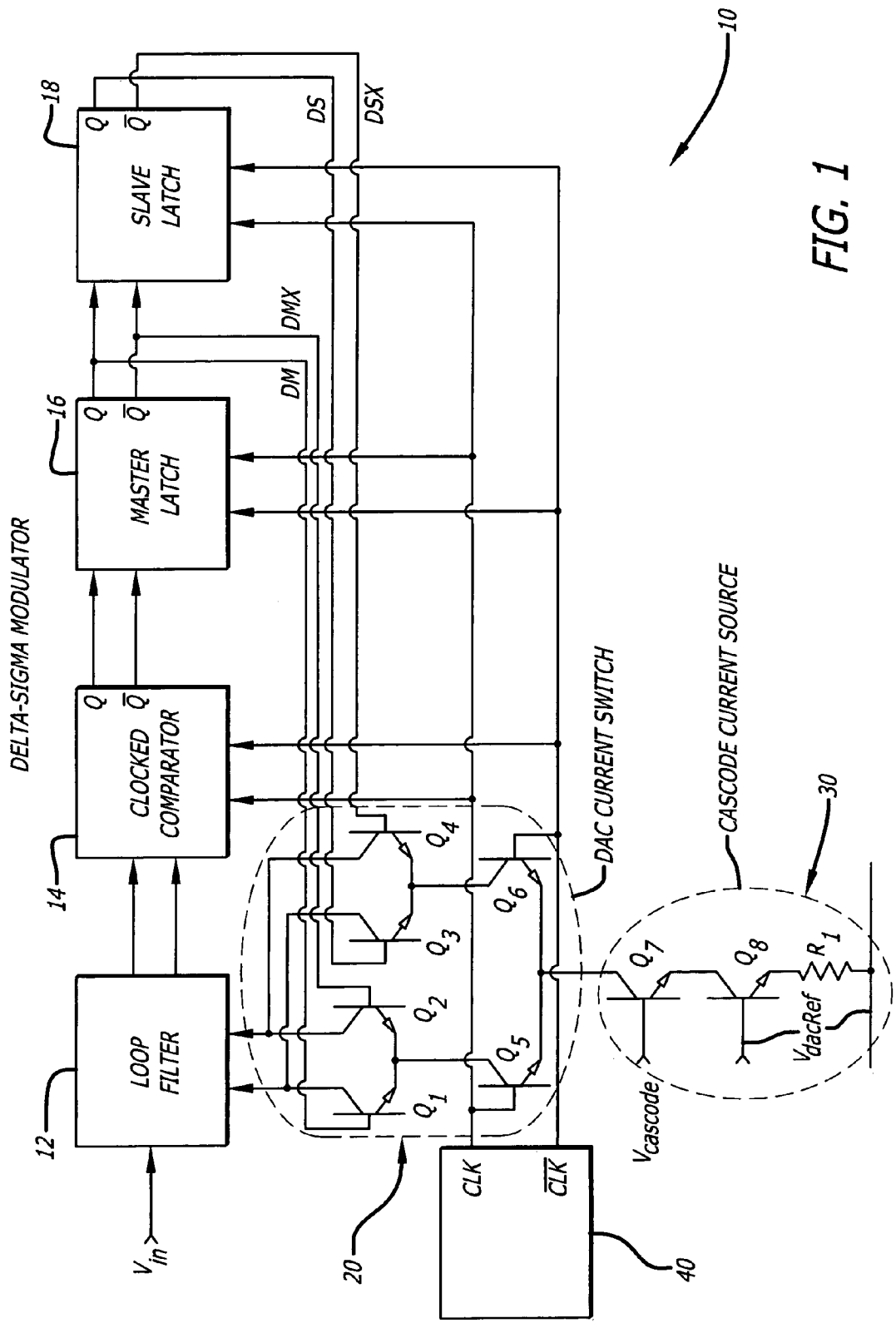
FIG. 1 is a circuit diagram showing an illustrative embodiment of the switch of the present invention is an illustrative delta-sigma modulator application.

FIG. 1 is a circuit diagram showing an illustrative embodiment of the switch of the present invention in an illustrative delta-sigma modulator application. The modulator 10 includes a loop filter 12 of conventional design and construction. As is common in the art, the loop filter 12 is an active filter with transconductors and integrators (not shown). The loop filter 12 provides noise shaping of an input signal. That is, the loop filter 12 shapes the quantization noise in the input signal to a minimum at a frequency at which the modulator will operate.

The loop filter provides complementary outputs which are input to a clocked comparator 14. The comparator 14 ascertains whether the outputs of the filter 12 are positive or negative and provides complementary digital outputs Q and Q-bar in response thereto. The digital outputs from the comparator 14 are input to a master latch 16. The master latch 16 provides differential voltage outputs complementary signals DM and DMX and thereby drives a slave latch 18. The slave latch 18 provides differential voltage outputs DS and DSX. Thus, if the output of the comparator goes to Q, then, assuming a clock with a 50% duty cycle, ½ clock cycle later, the master latch 16 goes to its Q state and ½ clock cycle later, the slave latch goes to its Q state.

The outputs of the master and slave latches 16 and 18 provide inputs to first and second differential pairs Q1/Q2 and Q3/Q4 of the switch 20 of the present invention. In the illustrative embodiment, NPN (in reference to N-type semiconductor material and P-P-type semiconductor material associated with NPN and PNP junction transistors) technology is employed. However, those skilled in the art will appreciate that PNP for FET technology may be employed as without departing from the scope of the present teachings.

The first and second transistors Q1 and Q2 of the first differential pair are coupled in a common emitter configuration as are the second and third transistors Q3 and Q4 of the second differential pair. The base of each transistor is fed by an output from an associated latch. That is, the DM signal from the Q output of the master latch 16 provides an input at the base of Q1, the DMX signal from the Q-bar output of the master latch 16 provides an input at the base of Q1, the DS signal from the Q output of the slave latch 18 feeds the base of Q3 and the DSX signal from the slave latch 18 feeds the base of Q4. The complementary outputs of Q1 and Q2 are input to the loop filter 12 in common with the complementary outputs of Q3 and Q4.

The switch 20 includes a third differential pair Q5/Q6 which serve to route current from a current source 30 to the first or the second differential pair Q1/Q2 and Q3/Q4 in response to a complementary clock signal from a clock 40. The collector of Q5 is coupled to the common emitter of Q5 and Q6. The collector of Q6 is coupled to the common emitter of Q3 and Q4. The common emitter of Q5 and Q6 is connected to the current source 30. In the illustrative embodiment, the current source is implemented as a cascode current source with a first transistor Q7 connected in cascode with a second transistor Q8. The transistor Q8 is connected to a source of negative potential via a resistor R1.

Thus, a continuous feedback path is provided to the loop filter 12 and the data fed back determines whether the feedback signal is positive or negative. As is known in the art, a 'continuous time' DAC (digital-to-analog converter) is one in which data is being output continuously up to the time of switching. (Paragraph Division Begins Here)

Figure 2:
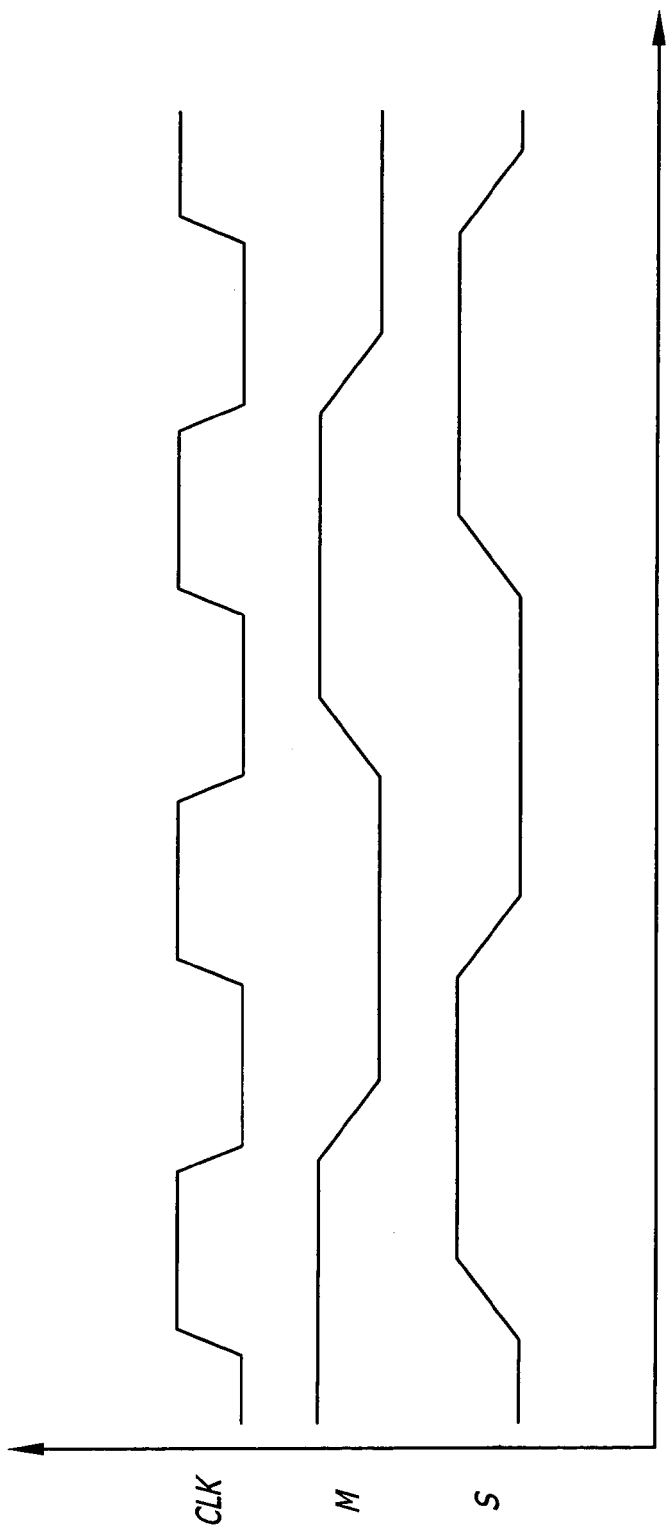
FIG. 2 is a timing diagram illustrating the operation of the switch of the present invention.

FIG. 2 is a timing diagram illustrating the operation of the switch of the present invention. The inputs are three differential signal pairs: the clock CLK/CLKX, and two copies of the data, DM/DMX and DS/DSX. As seen in FIG. 2, the two versions of the data differ in delay by one half of a clock period; DM and DS may be obtained respectively from the master and slave latches of a D flip-flop. DM changes state following a falling edge of CLK and DS changes state following a rising edge of CLK. As mentioned above, the differential pair Q1/Q2 is driven by the master latch output DM. The logic signal at the bases of Q1 and Q2 has had a half clock period to settle when CLK goes high and causes the DAC tail current to be steered through Q5 into the emitters of Q1/Q2. The current is then steered to the selected output according to the state of DM. During the time that CLK is high, DS has time to settle to its correct value so that when CLK goes low (CLKX goes high), the DAC current will be steered through Q6 to the emitters of Q3/Q4 and then to the correct output.

Small variations in the transition time of the data signals should have no effect on the timing of the current output of the overall DAC switch, inasmuch as the timing is determined by the clock after the data is settled.

Thus, the present invention provides a current switch for a digital to analog converter in which the timing of the current switching is controlled by a clocking signal and not by the data signal that determines which way the current is switched. The relative timing of the clock and data signals is such that the data is allowed to fully settle before the clock gates the DAC current to the differential pair controlled by the data. Two data switches gated by opposite phases of the clock are provided so that the current output waveform is equivalent to a single DAC switch driven by an NRZ data signal.

The signal to the upper differential pair, DM and DMX or DS and DSX, settles to its full steady state before current is switched into the emitters of the differential pair through the clock transistor. Thus, the signal at one pair is changing while the current is switched through the other pair. After the signal has settled, the clock goes high and current is steered through the DM pair driven by the master. While the current is flowing through the pair driven by the master, the inputs to the pair driven by the slave have a chance to settle as no current is flowing therethrough. After the inputs have settled, then the clock switches current through that pair. Hence, the inputs are allowed to settle to a full logic value before current is switched to the emitters of the differential pair. This prevents slight variations in timing from influencing the output.

Although the invention was described in the context of an illustrative delta-sigma modulator application, those skilled in the art will appreciate that the present teachings are not limited thereto. The present teachings may be employed in any application requiring a continuous time digital to analog conversion. That is, in some applications, the loop filter and the comparator may be eliminated and the master and slave latches driven directly. In this case, the outputs of the first and second differential pair serve as the output of the circuit.

Thus, the present invention has been described herein with reference to a particular embodiment for a particular application. Those having ordinary skill in the art and access to the present teachings will recognize additional modifications, applications and embodiments within the scope thereof.

It is therefore intended by the appended claims to cover any and all such applications, modifications and embodiments within the scope of the present invention.

What is claimed is:

1. A delta-sigma modulator comprising:
   a loop filter;
   a comparator coupled to the loop filter; and
   a switch, coupled to said comparator and said filter, said switch comprising:
   first means for providing a first set of first and second complementary intermediate signals;
   second means for providing a second set of third and fourth complementary intermediate signals;
   third means responsive to the first set of signals for providing complementary output signals;
   fourth means responsive to the second set of signals for providing complementary output signals; and
   fifth means for clocking said first means and said second means to apply said first set of signals to said third means on a first edge of a clock pulse and apply said second set of signals to said fourth means on a second edge of said clock pulse.

2. The invention of claim 1 wherein the first means is a master latch.

3. The invention of claim 2 wherein the second means is a slave latch.

4. The invention of claim 3 wherein the slave latch has inputs provided by the master latch.

5. The invention of claim 1 wherein the third means includes a first differential pair of transistors.

6. The invention of claim 5 wherein the first differential pair of transistors includes first and second transistors QI and Q2, respectively.

7. The invention of claim 6 wherein the first and second transistors are NPN transistors, for N-type semiconductor material and P-type semiconductor material.

8. The invention of claim 7 wherein the first and second transistors are connected in a common emitter configuration.

9. The invention of claim 6 wherein the first and second transistors are PNP transistors, for N-type semiconductor material and P-type semiconductor material.

10. The invention of claim 6 wherein the first and second transistors are field effect transistors.

11. The invention of claim 6 wherein a first intermediate signal is provided as an input to the first transistor and a second intermediate signal is provided as an input to the second transistor.

12. The invention of claim 6 wherein the fourth means includes a second differential pair of transistors.

13. The invention of claim 12 wherein the second differential pair of transistors includes third and fourth transistors Q3 and Q4, respectively.

14. The invention of claim 13 wherein the third and fourth transistors are NPN transistors, for N-type semiconductor material and P-type semiconductor material.

15. The invention of claim 14 wherein the third and fourth transistors are connected in a common emitter configuration.

16. The invention of claim 13 wherein the third and fourth transistors are PNP transistors, for N-type semiconductor material and P-type semiconductor material.

17. The invention of claim 13 wherein the third and fourth transistors are field effect transistors.

18. The invention of claim 13 wherein a third intermediate signal is provided as an input to the third transistor and a fourth intermediate signal is provided as an input to the fourth transistor.

19. The invention of claim 12 wherein the fifth means includes a third differential pair of transistors.

20. The invention of claim 19 wherein the fifth means includes fifth and sixth transistors Q5 and Q6 respectively.

21. The invention of claim 20 wherein the fifth and sixth transistors are NPN transistors, for N-type semiconductor material and P-type semiconductor material.

22. The invention of claim 21 wherein the fifth and sixth transistors are connected in a common emitter configuration.

23. The invention of claim 20 wherein the fifth and sixth transistors are PNV transistors, for N-type semiconductor material and P-type semiconductor material.

24. The invention of claim 20 wherein the fifth and sixth transistors are field effect transistors.

25. The invention of claim 20 wherein inputs to the fifth and sixth transistors are provided by complementaiy clock signals.

26. The invention of claim 25 wherein the fifth and sixth transistors have a terminal connected to a source and a terminal connected to one of the first and the second differential pair.

27. The invention of claim 26 wherein the source is a current source.

28. The invention of claim 27 wherein the source is a cascode current source.

29. A delta-sigma modulator comprising:
    a loop filter,
    a comparator coupled to the loop filter;
    a master latch coupled to said comparator for providing a first set of first and second complementary intermediate signals;
    a slave latch coupled to said master latch for providing a second set of third and fourth complementary intermediate signals;
    a first differential pair of transistors responsive to the first set of signals for providing a first set of complementary output signals;
    a second differential pair of transistors responsive to the second set of signals for providing a second set of complementaiy output signals; and
    means for switching current through said first differential pair of transistors and said second differential pair of transistors after the inputs thereof have settled to a full logic value.

30. The invention of claim 29 wherein the first differential pair of transistors includes first and second transistors Q1 and Q2, respectively.

31. The invention of claim 30 wherein the first and second transistors are NPN transistors, for N-type semiconductor material and P-type semiconductor material.

32. The invention of claim 31 wherein the first and second transistors are connected in a common emitter configuration.

33. The invention of claim 30 wherein the first and second transistors are PNP transistors, for N-type semiconductor material and P-type semiconductor material.

34. The invention of claim 30 wherein the first and second transistors are field effect transistors.

35. The invention of claim 30 wherein a first intermediate signal is provided as an input to the first transistor and a second intermediate signal is provided as an input to the second transistor.

36. The invention of claim 30 wherein the second differential pair of transistors includes third and fourth transistors Q3 and Q4, respectively.

37. The invention of claim 36 wherein the third and fourth transistors are NPN transistors, for N-type semiconductor material and P-type semiconductor material.

38. The invention of claim 37 wherein the third and fourth transistors are connected in a common emitter configuration.

39. The invention of claim 36 wherein the third and fourth transistors are PNP transistors, for N-type semiconductor material and P-type semiconductor material.

40. The invention of claim 36 wherein the third and fourth transistors are field effect transistors.

41. The invention of claim 36 wherein a third intermediate signal is provided as an input to the third transistor and a fourth intermediate signal is provided as an input to the fourth transistor.

42. The invention of claim 36 wherein the means for switching includes fifth and sixth transistors Q5 and Q6 respectively.

43. The invention of claim 42 wherein the fifth and sixth transistors are NPN transistors, for N-type semiconductor material and P-type semiconductor material.

44. The invention of claim 43 wherein the fifth and sixth transistors are connected in a common emitter configuration.

45. The invention of claim 42 wherein the fifth and sixth transistors are PNP transistors, for N-type semiconductor material and P-type semiconductor material.

46. The invention of claim 42 wherein the fifth and sixth transistors are field effect transistors.

47. The invention of claim 42 wherein inputs to the fifth and sixth transistors are provided by complementary clock signals.

48. The invention of claim 42 wherein the fifth and sixth transistors have a terminal connected to a source and a terminal connected to one of the first and the second differential pair.

49. The invention of claim 48 wherein the source is a current source.

50. The invention of claim 49 wherein the source is a cascode current source.

51. The invention of claim 29 wherein the means for switching includes a third differential pair of transistors.

* * * * *